United States Patent
Hasebe

(10) Patent No.: US 12,358,398 B2
(45) Date of Patent: Jul. 15, 2025

(54) ELECTRIC POWER DEVICE, DISPLAY DEVICE, CHARGING RATE CALCULATION METHOD, AND MEMORY MEDIUM

(71) Applicant: HONDA MOTOR CO., LTD., Tokyo (JP)

(72) Inventor: Manabu Hasebe, Wako (JP)

(73) Assignee: HONDA MOTOR CO., LTD., Tokyo (JP)

( * ) Notice: Subject to any disclaimer, the term of this patent is extended or adjusted under 35 U.S.C. 154(b) by 444 days.

(21) Appl. No.: 17/785,073

(22) PCT Filed: Dec. 17, 2020

(86) PCT No.: PCT/JP2020/047216
§ 371 (c)(1),
(2) Date: Jun. 14, 2022

(87) PCT Pub. No.: WO2021/125282
PCT Pub. Date: Jun. 24, 2021

(65) Prior Publication Data
US 2023/0010424 A1    Jan. 12, 2023

(30) Foreign Application Priority Data
Dec. 18, 2019  (JP) ................... 2019-228412

(51) Int. Cl.
*B60L 58/15*  (2019.01)
*G01R 31/387*  (2019.01)

(52) U.S. Cl.
CPC ............ *B60L 58/15* (2019.02); *G01R 31/387* (2019.01); *B60L 2240/549* (2013.01)

(58) Field of Classification Search
CPC ............... B60L 58/15; B60L 2240/549; B60L 2240/545; B60L 2240/547; B60L 2250/16;
(Continued)

(56) References Cited

U.S. PATENT DOCUMENTS 5,811,890 A * 9/1998 Hamamoto ............. H02J 9/061
                                                            307/66
6,532,425 B1 * 3/2003 Boost .................. G01R 31/3648
                                                            320/136
(Continued)

FOREIGN PATENT DOCUMENTS

CN     102520361     6/2012
CN     110174619     8/2019
(Continued)

OTHER PUBLICATIONS

Japanese Office Action for Japanese Patent Application No. 2021-565649 dated Sep. 3, 2024.
(Continued)

*Primary Examiner* — M Baye Diao
(74) *Attorney, Agent, or Firm* — Amin, Turocy & Watson, LLP

(57) ABSTRACT

In an electric power device and a charging rate calculation method according to the present invention, a control unit: calculates a sum total (FCC) of respective full charging capacities of a plurality of detachable/attachable batteries; calculates a sum total (RC) of respective present charging capacities of the plurality of detachable/attachable batteries; and calculates an RSOC, which is an overall state of charge (SOC) of the plurality of detachable/attachable batteries, on the basis of the calculated sum total (FCC) of full charging capacities and the calculated sum total (RC) of present charging capacities.

14 Claims, 10 Drawing Sheets

(58) Field of Classification Search
CPC ... B60L 58/10; G01R 31/387; G01R 31/3828; G01R 31/396; H02J 7/0048; Y02E 60/10
USPC ........................................................ 320/127
See application file for complete search history.

(56) References Cited

U.S. PATENT DOCUMENTS

| | | | | |
|---|---|---|---|---|
| 7,952,224 | B2 * | 5/2011 | Sawada | ............... B60L 15/2009 |
| | | | | 903/907 |
| 9,272,635 | B2 * | 3/2016 | Izumi | ................... H02J 7/0048 |
| 9,365,129 | B2 * | 6/2016 | Kikuchi | ................. B60L 58/21 |
| 9,827,871 | B2 * | 11/2017 | Del Core | ................ B60L 58/27 |
| 2011/0257915 | A1 | 10/2011 | Yamamoto et al. | |
| 2014/0239914 | A1 | 8/2014 | Igarashi et al. | |
| 2016/0001766 | A1 * | 1/2016 | Mori | ....................... B60L 50/60 |
| | | | | 903/903 |
| 2017/0373355 | A1 | 12/2017 | Kagawa et al. | |
| 2018/0201142 | A1 * | 7/2018 | Galin | ....................... H02J 3/14 |
| 2019/0033387 | A1 | 1/2019 | Ito et al. | |
| 2019/0039474 | A1 | 2/2019 | Wada et al. | |
| 2019/0257891 | A1 | 8/2019 | Kim et al. | |

FOREIGN PATENT DOCUMENTS

| | | | | |
|---|---|---|---|---|
| JP | 07-169510 | | 7/1995 | |
| JP | 2000-092604 | | 3/2000 | |
| JP | 2000-115902 | | 4/2000 | |
| JP | 2011-226805 | | 11/2011 | |
| JP | 2012-175734 | | 9/2012 | |
| JP | 2015-070782 | | 4/2015 | |
| JP | 5839873 B2 * | 1/2016 | ............... B66B 1/34 |
| JP | 2016-025791 | | 2/2016 | |
| JP | 5882336 B2 * | 3/2016 | ........... G01R 31/362 |
| JP | 2017-034951 | | 2/2017 | |
| JP | 2017-093250 | | 5/2017 | |
| JP | 2018-066682 | | 4/2018 | |
| JP | 2018055793 A * | 4/2018 | ............. Y02E 60/10 |
| JP | 2019-029173 | | 2/2019 | |
| JP | 2019-187189 | | 10/2019 | |
| WO | WO-2013031559 A1 * | 3/2013 | ........... G01R 31/362 |
| WO | 2013/051135 | | 4/2013 | |
| WO | 2016/147302 | | 9/2016 | |
| WO | 2017/022342 | | 2/2017 | |

OTHER PUBLICATIONS

International Search Report and Written Opinion for International Application No. PCT/JP2020/047216 mailed on Mar. 9, 2021, 13 pages.
Chinese Office Action and Search Report for Chinese Patent Application No. 202080088043.3 dated Apr. 30, 2025.

* cited by examiner

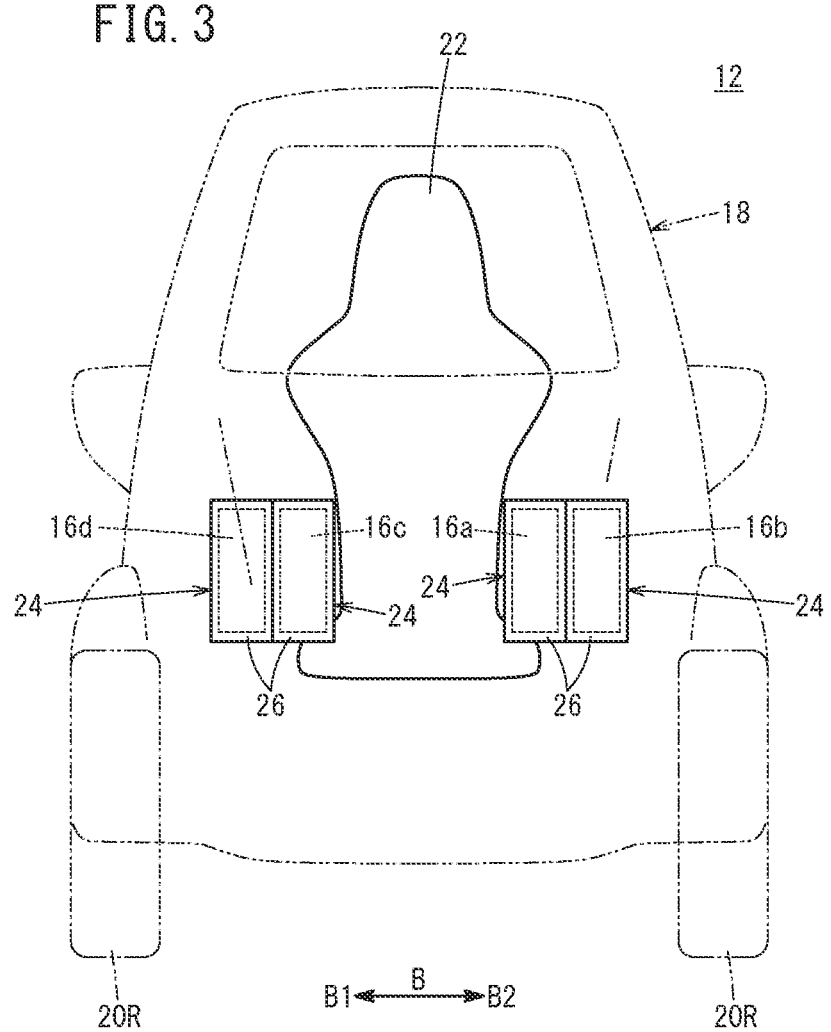

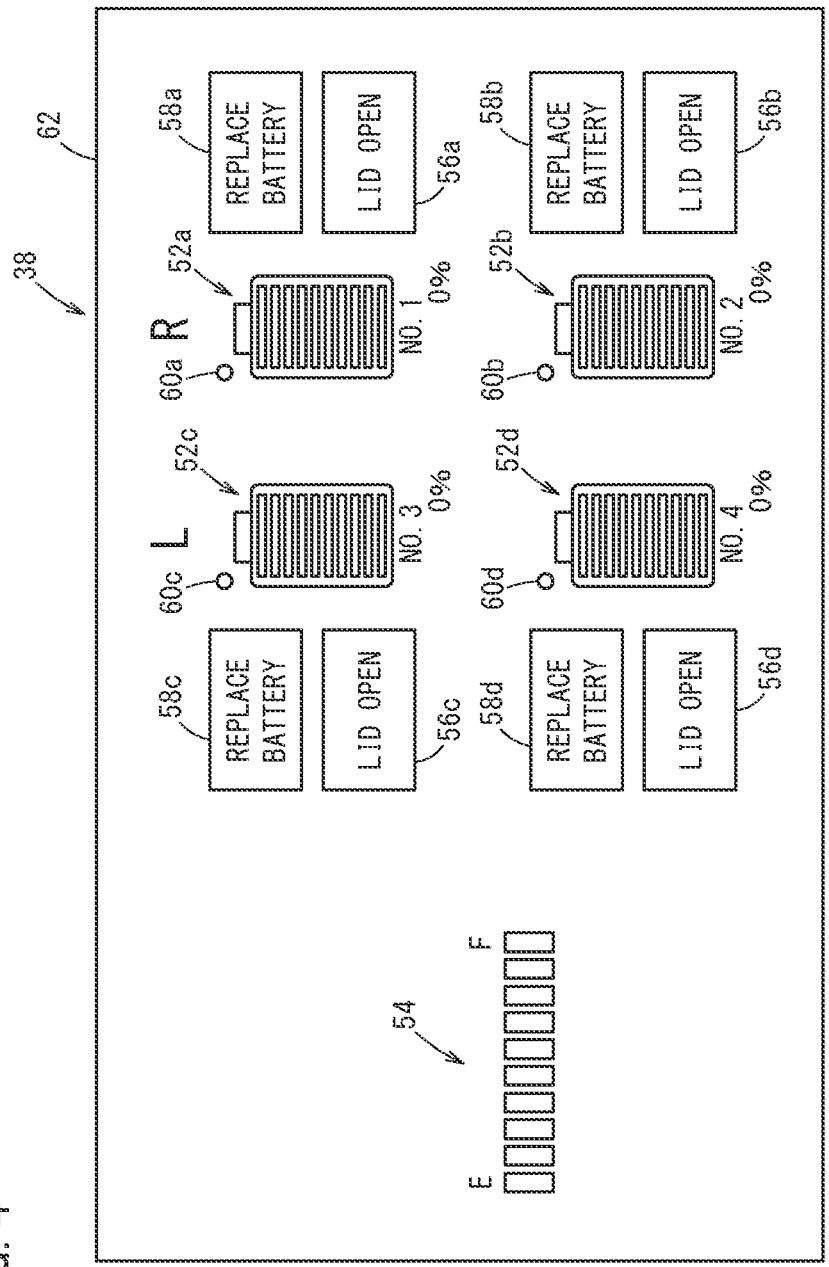

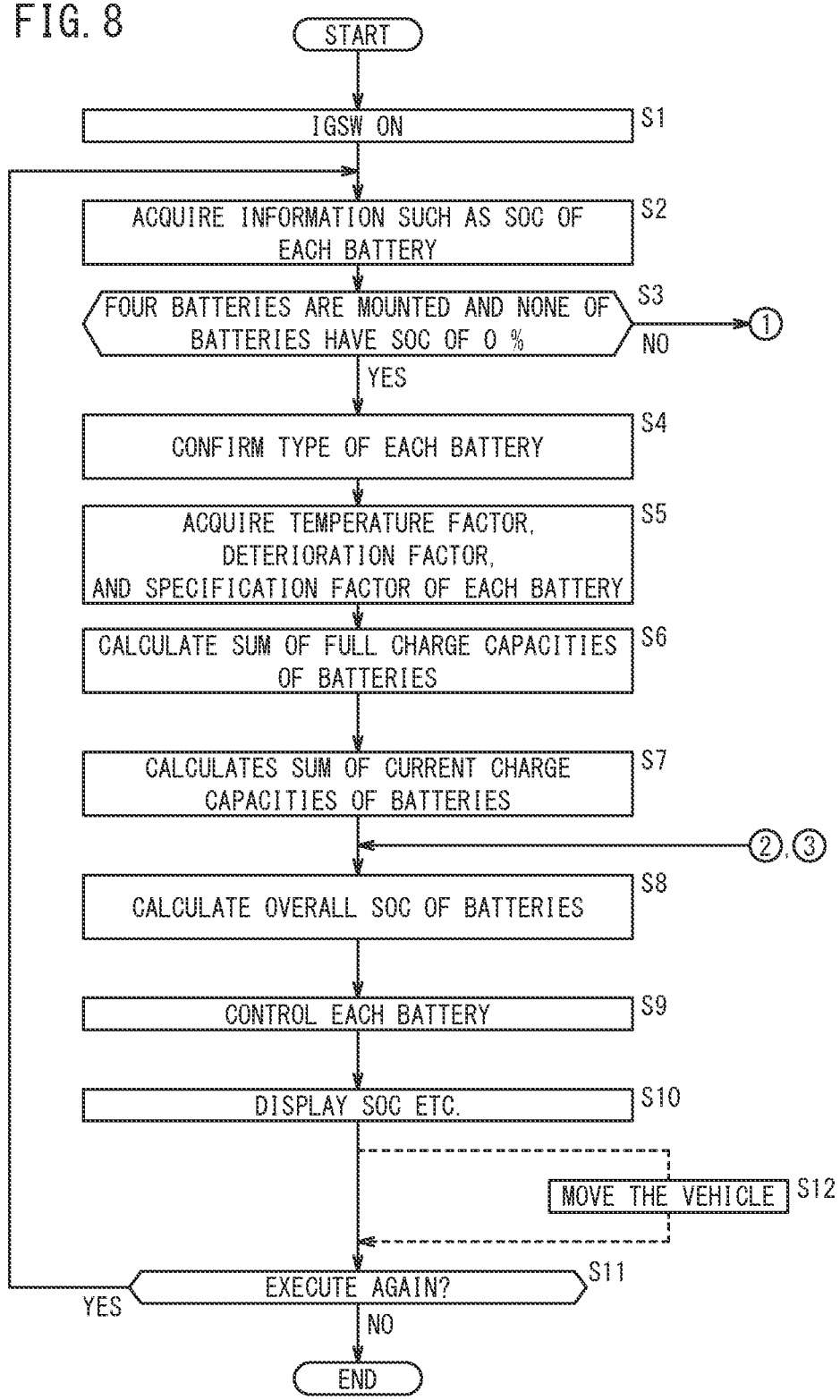

ELECTRIC POWER DEVICE, DISPLAY DEVICE, CHARGING RATE CALCULATION METHOD, AND MEMORY MEDIUM

TECHNICAL FIELD

The present invention relates to an electric power device having a plurality of chargeable/dischargeable electric power storage units, a display device for displaying an overall state of charge (overall charging rate) of the plurality of electric power storage units, a state of charge (charging rate) calculation method for calculating the overall state of charge of the plurality of electric power storage units, a program for calculating the overall state of charge of the plurality of electric power storage units, and a storage medium (memory medium) storing the program.

BACKGROUND ART

For example, JP 2000-092604 A discloses that a remaining capacity or a state of charge of a battery (electric power storage unit) mounted in a battery vehicle (electric vehicle) is detected in real time, and the detection result is displayed on a remaining capacity indicator.

SUMMARY OF THE INVENTION

When the plurality of electric power storage units have different specifications such as a temperature, a degree of deterioration, or a type, even if the average value of the charging rates (SOCs) of the respective electric power storage units is simply calculated, the calculated average value may not be the overall SOC of the plurality of electric power storage units.

The present invention has been devised taking into consideration the aforementioned problems, and has the object of providing an electric power device, a state of charge calculation method, a program, and a storage medium capable of accurately obtaining the overall state of charge of a plurality of electric power storage units. The present invention has another object of providing a display device that is capable of displaying the thus-obtained overall state of charge of the plurality of electric power storage units thus obtained.

According to a first aspect of the present invention, there is provided an electric power device including a plurality of electric power storage units that are chargeable and dischargeable. The electric power device includes a state of charge calculation unit configured to calculate an overall state of charge of the plurality of electric power storage units, based on a sum of full charge capacities of the respective electric power storage units and a sum of current charge capacities of the respective electric power storage units.

According to a second aspect of the present invention, there is provided a display device including a receiving unit configured to receive the overall state of charge of the plurality of electric power storage units from the above-mentioned electric power device. The display device is configured to display the received overall state of charge of the plurality of electric power storage units.

According to a third aspect of the present invention, there is provided a state of charge calculation method for an electric power device including a plurality of electric power storage units that are chargeable and dischargeable. The method includes the steps of acquiring full charge capacities of the plurality of electric power storage units, respectively, calculating a sum of the plurality of full charge capacities, acquiring current charge capacities of the plurality of electric power storage units, respectively, calculating a sum of the plurality of current charge capacities, and calculating an overall state of charge of the plurality of electric power storage units based on the sum of the full charge capacities and the sum of the current charge capacities.

According to a fourth aspect of the present invention, there is provided a program causing a computer to execute the steps of acquiring full charge capacities of a plurality of electric power storage units, respectively, calculating a sum of the plurality of full charge capacities, acquiring current charge capacities of the plurality of electric power storage units, respectively, calculating a sum of the plurality of current charge capacities, and calculating an overall state of charge of the plurality of electric power storage units based on the sum of the full charge capacities and the sum of the current charge capacities.

According to a fifth aspect of the present invention, there is provided a storage medium storing the above-mentioned program.

According to the present invention, by using the sum of the full charge capacities of the respective electric power storage units and the sum of the current charge capacities of the respective electric power storage units, it is possible to accurately calculate the overall state of charge of the plurality of electric power storage units. Further, in the present invention, it is possible to display the overall state of charge of the plurality of electric power storage units acquired in this way.

BRIEF DESCRIPTION OF DRAWINGS

FIG. 3 is a schematic rear view of the vehicle of FIG. 2;

FIG. 4 is a diagram illustrating a display example of the display device in FIG. 1;

FIG. 8 is a flowchart illustrating a first example of the operation (state of charge calculation method) of the electric power device according to the present embodiment;

DESCRIPTION OF THE INVENTION

Hereinafter, preferred embodiments of an electric power device, a display device, a state of charge calculation method, a program, and a storage medium according to the present invention will be exemplified and described below with reference to the accompanying drawings.

1. Outline Configuration of Present Embodiment

Figure 1:
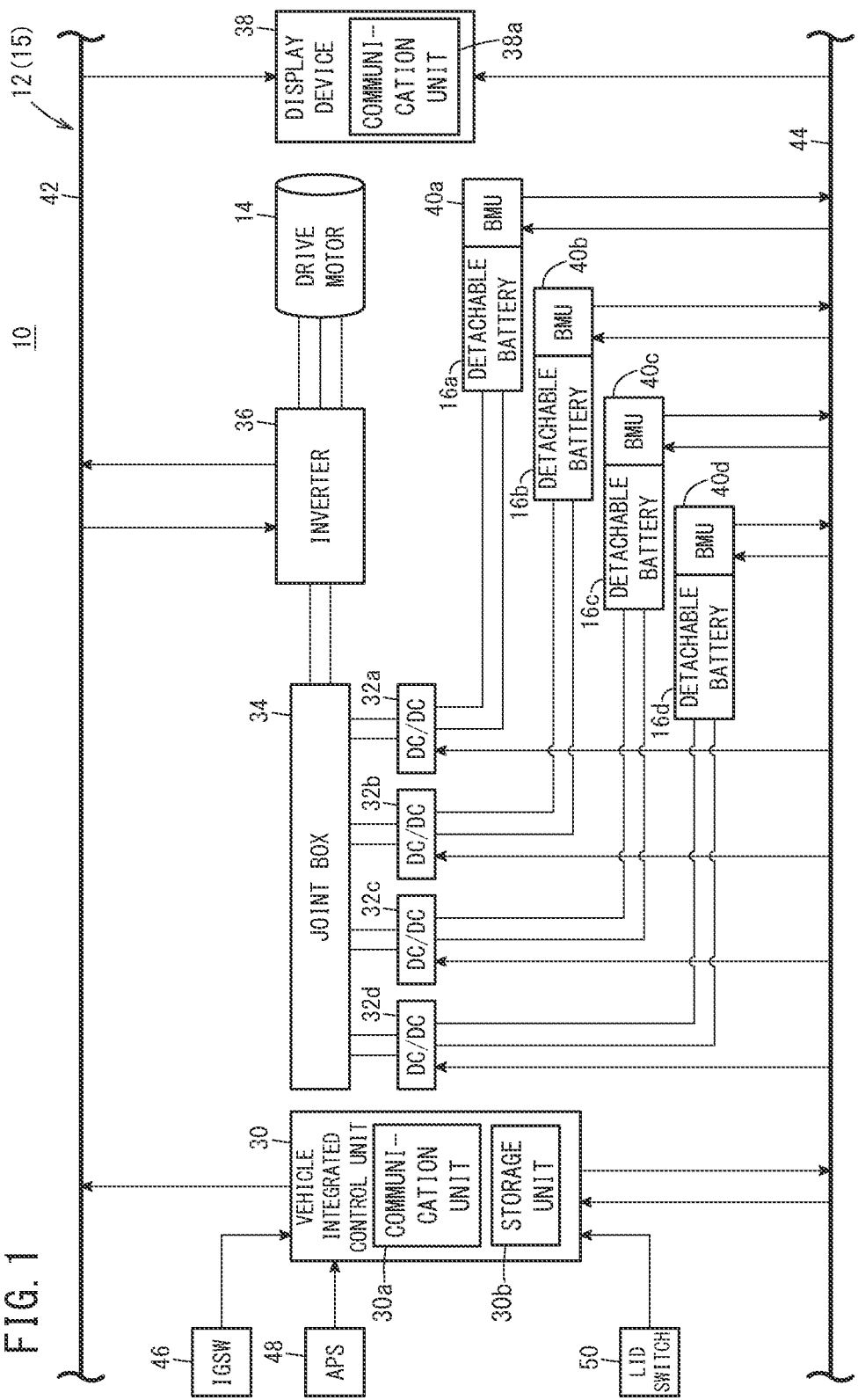
FIG. 1 is a configuration diagram of an embodiment of an electric power device according to a present embodiment.

FIG. 1 is a configuration diagram of an embodiment of an electric power device 10 according to a present embodiment. FIG. 1 illustrates a case where the electric power device 10 according to the present embodiment is applied to an electric power supply system 15 (electric power supply system). The electric power supply system 15 supplies electric power to a drive motor 14. The drive motor 14 is a drive source (load) of a vehicle 12.

Figure 2:
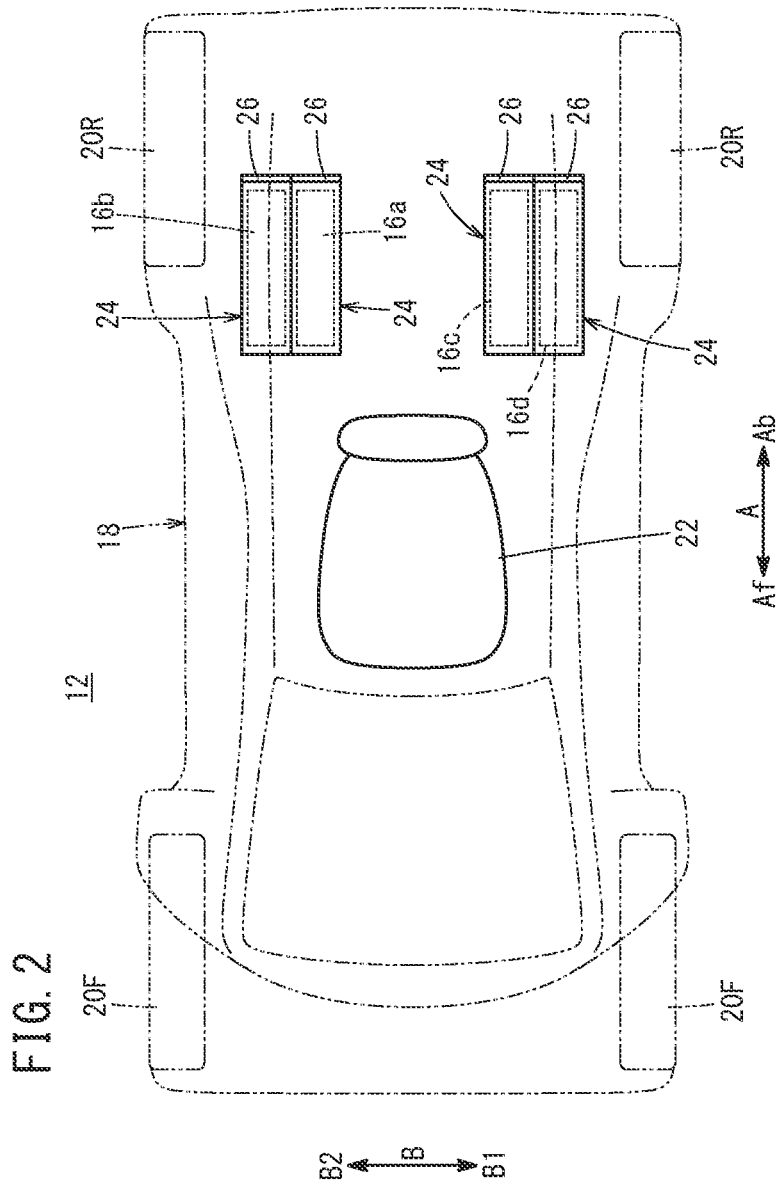
FIG. 2 is a schematic plan view of a vehicle in which the electric power device of FIG. 1 is mounted.

As shown in FIGS. 2 and 3, the vehicle 12 is a four-wheeled electric vehicle. Four detachable batteries 16a to 16d (electric power storage units) are detachably mounted in the vehicle 12. The four detachable batteries 16a to 16d constitute the electric power device 10. The four detachable batteries 16a to 16d supply electric power to the drive motor 14 in FIG. 1. In the following description, when the plurality of detachable batteries 16a to 16d are not particularly distinguished, they are also referred to as detachable batteries 16 when not particularly distinguished from each other. Further, each of the detachable batteries 16 is charged by an external charger (not illustrated) in a state of being detached from the vehicle 12. That is, the detachable batteries 16 are chargeable and dischargeable electric power storage devices.

In the present embodiment, the vehicle 12 may be any vehicle in which the drive motor 14 is mounted, e.g., an electrically driven vehicle such as an electric vehicle, or a hybrid vehicle. Therefore, the application of the electric power device 10 according to the present embodiment is not limited to a four-wheeled electric vehicle. The electric power device 10 can be applied to electric power supply systems of various vehicles such as one-wheeled, two-wheeled, and four-wheeled vehicles.

The application of the electric power device 10 is not limited to the electric power supply system 15 of the vehicle 12. The electric power device 10 can be applied to various electric power supply systems that supply power from the detachable batteries 16 to loads such as the drive motor 14. Therefore, the electric power device 10 can be applied to an electric power supply system that is capable of supplying electric power to a load in various mobile bodies including the vehicle 12 and an aerial vehicle, and various electronic devices.

Further, the detachable battery 16 may be a portable electric power storage device that can be attached to and detached from the electric power device 10, the vehicle 12, or the like. Accordingly, the electric power device 10 can employ various types of electric power storage devices as the detachable battery 16, including standard battery packs, high-power battery packs, high-capacity battery packs, and batteries for hybrid vehicles. The number of the detachable batteries 16 included in the electric power device 10 may be two or more.

In the following description, as shown in FIGS. 1 to 3, a case in which electric power is supplied from four detachable batteries 16 to the drive motor 14 in the electric power supply system 15 of a four-wheeled electric vehicle will be described.

As shown in FIGS. 2 and 3, in the vehicle 12, a seat 22 is provided at a substantially central portion in a front-rear direction (a direction of arrow A as a vehicle longitudinal direction) of a vehicle body 18. That is, the seat 22 is provided at a substantially intermediate position between front wheels 20F and rear wheels 20R. The front wheels 20F are provided at locations (front portion) in the direction of arrow Af in the vehicle 12. The rear wheels 20R are provided at locations (rear portion) in the direction of arrow Ab in the vehicle 12. The seat 22 is a driver's seat. The four detachable batteries 16a to 16d (16) are disposed in the left-right direction of the vehicle body 18 (a direction of arrow B as the vehicle widthwise direction).

More specifically, two electric power storage device housing units 24 are provided in the vicinity of the upper side of one of the left rear wheels 20R in a direction of arrow B1 (left portion) in the vehicle body 18. Each of the two electric power storage device housing units 24 can accommodate one detachable battery 16. The two electric power storage device housing units 24 are arranged in the direction of arrow B. Further, two electric power storage device housing units 24 are provided in the vicinity of the upper side of one of the left rear wheels 20R in a direction of arrow B2 (right portion) in the vehicle body 18. Each of the two electric power storage device housing units 24 can accommodate one detachable battery 16. The two electric power storage device housing units 24 are arranged in the direction of arrow B. A lid member 26 is provided in a direction of arrow Ab (rear portion) of each electric power storage device housing unit 24. The lid member 26 is opened when the detachable battery 16 is attached or detached. Incidentally, the arrangement of the four detachable batteries 16a to 16d are not limited to the arrangement of FIGS. 2 and 3. The four detachable batteries 16a to 16d can be disposed at arbitrary positions in the vehicle 12 within an area where the detachable batteries 16 do not hinder the driving operation of a driver seated on the seat 22.

Returning to FIG. 1, the electric power device 10 (electric power supply system 15) includes a vehicle integrated control unit 30 (state of charge calculation unit), DC/DC converters 32a to 32d, a joint box 34, and an inverter 36. The electric power supply system 15 is also provided with a display device 38. Further, the respective detachable batteries 16a to 16d include battery management units 40a to 40d (hereinafter referred to as BMUs 40a to 40d). In the following description, the vehicle integrated control unit 30 may also be referred to as a control unit 30. When the DC/DC converters 32a to 32d are not particularly distinguished from each other, they may also be referred to as DC/DC converters 32. Further, when the plurality of BMUs 40a to 40d are not particularly distinguished from each other, they may also be referred to as BMUs 40.

The control unit 30 includes a communication unit (transmission unit) 30a. The display device 38 includes a communication unit (receiving unit) 38a. The communication units 30a and 38a are connected to CANs 42 and 44, respectively. The CAN 42 communicates with each device in the vehicle 12. The CAN 44 communicates with the respective devices that are related to the detachable batteries 16a to 16d. The DC/DC converters 32a to 32d and the BMU 40a to BMU 40d of the respective detachable batteries 16a to 16d are connected to the CAN 44.

The control unit 30 is a computer (information processing device). The control unit 30 is an ECU (electronic control unit) mounted in the vehicle 12. The control unit 30 realizes various functions including calculation of a state of charge described later by reading and executing programs stored in a storage unit 30b. The storage unit 30b is a non-transitory storage medium. That is, the control unit 30 acquires an ignition signal from an ignition switch 46. The ignition switch 46 is a drive switch of the vehicle 12. The ignition signal is an ON signal. Further, the control unit 30 acquires accelerator pedal opening information from an accelerator pedal sensor 48. In this case, the control unit 30 sets the torque of the drive motor 14 in accordance with the accelerator pedal opening information. The control unit 30 outputs the set torque from the communication unit 30*a* to the CAN 42 as a torque command value. Further, the control unit 30 sets a current command value according to the torque command value. The current command value is a PWM signal for converting the output voltage of the detachable battery 16. The control unit 30 outputs the set current command value from the communication unit 30*a* to the CAN 44.

Further, the control unit 30 acquires a lid opening/closing signal from a lid switch 50. The lid opening/closing signal is a signal indicating a detection result of opening/closing of the lid member 26. The control unit 30 sets the display content of the display device 38 according to the open state or the closed state of the lid member 26 indicated by the lid opening/closing signal. The control unit 30 outputs a display control signal indicating the set display content from the communication unit 30*a* to the CAN 44.

Further, when the communication unit 30*a* acquires (receives) the information of the detachable batteries 16*a* to 16*d* from the BMU 40*a* to BMU 40*d* via the CAN 44, the control unit 30 grasps an SOC (state of charge, hereinafter also referred to as a charging rate or charge capacity) of each of the plurality of detachable batteries 16*a* to 16*d* based on the acquired information. When any of the detachable batteries 16*a* to 16*d* has the SOC less than the predetermined value, the control unit 30 sets the display content indicating that the replacement of such detachable batteries 16*a* to 16*d* is notified. The control unit 30 outputs a display control signal indicating the set display content from the communication unit 30*a* to the CAN 44.

Furthermore, the control unit 30 determines whether or not each of the detachable batteries 16*a* to 16*d* is loaded in the electric power storage device housing unit 24, based on the information of each of the detachable batteries 16*a* to 16*d* acquired by the communication unit 30*a*. That is, the control unit 30 determines whether or not the detachable batteries 16*a* to 16*d* and the DC/DC converters 32*a* to 32*d* are electrically connected to each other, respectively. The control unit 30 sets the display content according to the determination result. The control unit 30 outputs a display control signal indicating the set display content from the communication unit 30*a* to the CAN 44.

Further, the control unit 30 calculates the overall SOC of the plurality of detachable batteries 16*a* to 16*d* from the information of each of the detachable batteries 16*a* to 16*d* acquired by the communication unit 30*a*. The overall SOC herein means an SOC (charging rate) of electric power storage device when the plurality of detachable batteries 16*a* to 16*d* are regarded as one electric power storage device. The control unit 30 sets the display content of the calculated overall SOC of each of the detachable batteries 16*a* to 16*d*. The control unit 30 outputs a display control signal indicating the set display content from the communication unit 30*a* to the CAN 44.

The BMUs 40*a* to 40*d* each manage the SOC, the temperature (temperature factor), the deterioration degree (deterioration level, deterioration factor), the internal resistance, and the current charge capacity as a remaining capacity, of each of the detachable batteries 16*a* to 16*d*, as well as connection states between the detachable batteries 16*a* to 16*d* and the DC/DC converters 32*a* to 32*d*, respectively. The BMUs 40*a* to 40*d* also manage the specifications (specification difference value such as a specification factor), the specification values or initial values of the full charge capacities, and the current full charge capacities, concerning the detachable batteries 16*a* to 16*d*. The BMUs 40*a* to 40*d* output these pieces of information to the CAN 44.

Therefore, the control unit 30 acquires the current charge capacities, the current full charge capacities, and the specification values or initial values of the full charge capacities, and the like of the detachable batteries 16*a* to 16*d*, from the BMUs 40*a* to 40*d*. The specification value of the full charge capacity refers to a standard value of the full charge capacity of each of the detachable batteries 16*a* to 16*d*. The initial value of the full charge capacity refers to a value (initial full charge amount) of the full charge capacity at the start of use (at the time of shipment from the factory) of each of the detachable batteries 16*a* to 16*d*.

The DC/DC converters 32 each convert the output voltage of each of the detachable batteries 16 according to the current command value. The converted output voltage is output to the joint box 34. The joint box 34 supplies DC power from each of the detachable batteries 16 to the inverter 36. The inverter 36 converts the DC power supplied from the joint box 34 into three-phase AC power in accordance with the torque command value. The converted three-phase AC power is supplied to the drive motor 14. Further, the inverter 36 outputs the rotational speed information and the actual torque information of the drive motor 14 to the CAN 42.

The display device 38 is configured by a screen 62 (see FIG. 4) and a processing device. The screen 62 is set on a dashboard or the like of the vehicle 12. The processing device processes characters or images to be displayed on the screen 62. Information from the inverter 36 or the drive motor 14 is input to (or received by) the display device 38 via the communication unit 38*a*. The SOC information (information on various charging rates or charge capacities) of the detachable batteries 16 and a display control signal of the control unit 30 are input to (or received by) the display device 38 from the CAN 44 via the communication unit 38*a*. The display device 38 displays a state of each of the detachable batteries 16 based on various kinds of information input to the communication unit 38*a*.

2. Display Content on Display Device 38

FIG. 4 is a diagram illustrating a display example of the display device 38. The display device 38 includes battery remaining amount display units 52*a* to 52*d*, a total remaining amount display unit 54, open/closed state display units 56*a* to 56*d*, battery replacement display unit 58*a* to 58*d*, and battery connection state display unit 60*a* to 60*d*.

Each of the battery remaining amount display units 52*a* to 52*d* are provided on the right side of the screen 62 of the display device 38. Among them, the two battery remaining amount display units 52*a* and 52*b* on the right side correspond to the two detachable batteries 16*a* and 16*b*. The two detachable batteries 16*a* and 16*b* are disposed on the right side of the vehicle body 18 (see FIGS. 2 and 3). The two battery remaining amount display units 52*c* and 52*d* on the left side correspond to the two detachable batteries 16*c* and 16*d*. The two detachable batteries 16*c* and 16*d* are disposed on the left side of the vehicle body 18.

The battery remaining amount display units 52*a* to 52*d* display the numbers of the detachable batteries 16*a* to 16*d*, respectively. Each of the battery remaining amount display units 52*a* to 52*d* displays an illustration simulating a dry battery in which a bar-shaped graph is arranged. Each of the battery remaining amount display units 52a to 52d displays a numerical value of the SOC of each of the detachable batteries 16a to 16d. The bar graph inside the dry battery illustration changes in the vertical direction in accordance with the magnitude of the SOC of each of the corresponding detachable batteries 16a to 16d.

In FIG. 4, ten segments are arranged inside the dry battery illustration. The ten segments are rectangular. The ten segments are arranged in the vertical direction. Each segment is formed of, for example, an LED. When one segment is illuminated or turned on, 10% of the SOC is displayed. In FIGS. 4 to 7B, an illuminated state is illustrated by hatching. In FIGS. 4 to 7B, a non-illuminated (extinguished or turned off) state is shown in white. Therefore, each of the battery remaining amount display units 52a to 52d is illuminated in order from the lowermost segment to the uppermost segment in accordance with the magnitude of the SOC of the corresponding detachable batteries 16a to 16d. Thus, the magnitude of the SOC is schematically displayed.

Figure 5A:
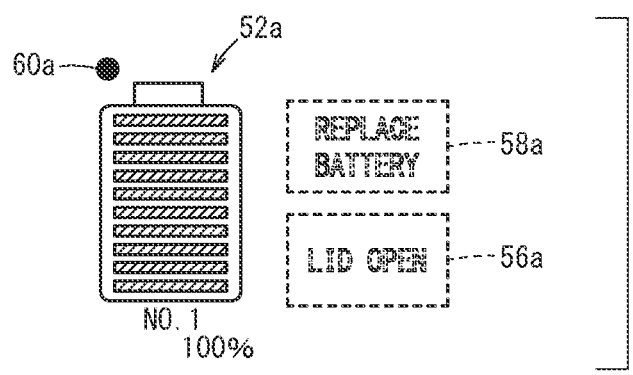
FIG. 5A is a diagram illustrating a display example of a fully charged state.
Figure 5B:
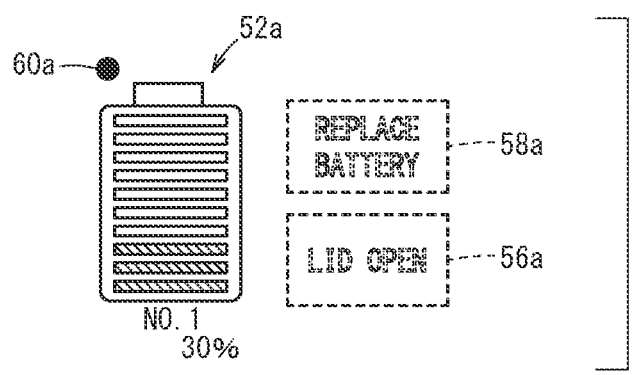
FIG. 5B is a diagram illustrating a display example when the SOC has decreased.
Figure 6A:
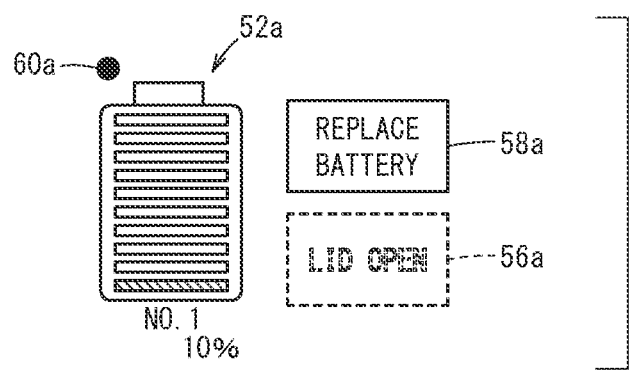
FIG. 6A is a diagram illustrating a display example of battery replacement.

In FIG. 4, none of segments are illuminated. FIG. 4 shows that the SOC of each of the detachable batteries 16a to 16d is 0%. In FIG. 5A, all segments are illuminated for one detachable battery 16a. FIG. 5A shows that the SOC of the detachable battery 16a is 100%. In FIG. 5B, the three lowest segments are illuminated. FIG. 5B shows that the SOC of the detachable battery 16a is 30%. In FIG. 6A, the lowest segment is illuminated. FIG. 6A shows that the SOC of the detachable battery 16a is 10%.

In this case, the color of the illuminated segment may be changed according to the magnitude of the SOC. In FIGS. 5B and 6A, the direction of hatching in the segments is different from that in FIG. 5A. FIG. 5B and FIG. 6A show that the segments are illuminated in a color that is different from a color of the segments in FIG. 5A.

Around an illustration simulating a dry battery in each of the battery remaining amount display units 52a to 52d, the open/closed state display units 56a to 56d, the battery replacement display units 58a to 58d, and the battery connection state display units 60a to 60d are arranged, respectively. These display units are provided around the battery remaining amount display units 52a to 52d of the corresponding detachable batteries 16a to 16d, respectively.

If any of the open/closed state display units 56a to 56d is illuminated, it indicates that the lid member 26 of the electric power storage device housing unit 24 housing a corresponding one of the detachable batteries 16a to 16d is open. If any of the open/closed state display units 56a to 56d is not illuminated, it indicates that such a lid member 26 is closed. In FIGS. 4 to 7B, the illuminated state is indicated by solid lines. In FIGS. 4 to 7B, the non-illuminated state is indicated by broken lines.

If any of the battery replacement display units 58a to 58d is illuminated, it indicates that a corresponding one of the detachable batteries 16a to 16d needs to be replaced. If any of the battery replacement display units 58a to 58d is not illuminated, it indicates that replacement is unnecessary. In FIGS. 4 to 7B, the illuminated state is indicated by solid lines. In FIGS. 4 to 7B, the non-illuminated state is indicated by broken lines.

If any of the battery connection state display units 60a to 60d is illuminated, it indicates that a corresponding one of the detachable batteries 16a to 16d is loaded in the electric power storage device housing unit 24. If any of the battery connection state display units 60a to 60d is illuminated, it indicates that the corresponding one of the detachable batteries 16a to 16d and a corresponding one of the DC/DC converters 32a to 32d are electrically connected to each other. In addition, if any of the battery connection state display units 60a to 60d is not illuminated, it indicates that a corresponding one of the detachable batteries 16a to 16d is not loaded in the electric power storage device housing unit 24. Alternatively, if any of the battery connection state display units 60a to 60d is not illuminated, it indicates that the corresponding one of the detachable batteries 16a to 16d and the corresponding one of the DC/DC converters 32a to 32d are not electrically connected to each other even when the corresponding detachable battery is loaded. In FIGS. 4 to 7B, the illuminated state is indicated by a black circle. In FIGS. 4 to 7B, the non-illuminated state is indicated by a white circle.

The total remaining amount display unit 54 displays the overall SOC of the four detachable batteries 16a to 16d. The total remaining amount display unit 54 is configured by ten segments. The ten segments are arranged in a horizontal direction. Each segment is formed of, for example, an LED. When one segment is illuminated, 10% of the SOC is displayed. Accordingly, the total remaining amount display unit 54 is illuminated in order from the leftmost segment (E indicating 0% SOC) toward the rightmost segment (F indicating 100% SOC) according to the magnitude of the overall SOC of each of the detachable batteries 16a to 16d. Thus, an approximate magnitude of the SOC is displayed.

FIGS. 5A to 7B illustrate a change in display content of the display device 38 before and after the battery replacement for one detachable battery 16a. For each of the other detachable batteries 16b to 16d, the display content of the display device 38 change in the same manner at the time of battery replacement.

FIG. 5A shows a case where the detachable battery 16a is housed in the electric power storage device housing unit 24 (see FIGS. 2 and 3), the lid member 26 is closed, and the SOC of the detachable battery 16a is 100%. In this case, all the segments in the battery remaining amount display unit 52a are illuminated. The characters "100%" indicating that the numerical value of the SOC are displayed in the battery remaining amount display unit 52a. In addition, the battery connection state display unit 60a is illuminated. The open/closed state display unit 56a and the battery replacement display unit 58a are not illuminated.

FIG. 5B shows a case where the SOC of the detachable battery 16a has dropped to 30%. In this case, the three lowermost segments are illuminated in the battery remaining amount display unit 52a. The characters "30%" indicating the numerical value of the SOC are displayed in the battery remaining amount display unit 52a. Since the SOC has dropped, the three lowermost segments are illuminated in a color that is different from a color in the case of FIG. 5A.

FIG. 6A shows a case where the SOC of the detachable battery 16a has dropped to 10%. In this case, in the battery remaining amount display unit 52a, the one lowermost segment is illuminated. The characters "10%" indicating the numerical value of the SOC are displayed in the battery remaining amount display unit 52a. When the battery replacement display unit 58a is illuminated, the driver or the like is prompted to replace the detachable battery 16a.

Figure 6B:
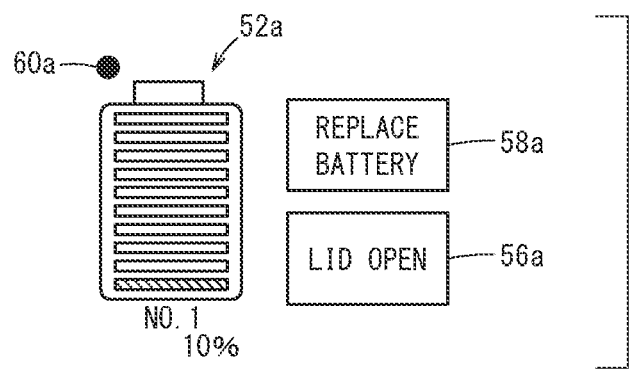
FIG. 6B is a diagram illustrating a display example when a lid member is opened.

Seeing the screen display of FIG. 6A, the driver or the like opens the lid member 26 (see FIGS. 2 and 3) of the electric power storage device housing unit 24 that houses the detachable battery 16a. As a result, the screen 62 of the display device 38 is switched to the display content of FIG. 6B. In FIG. 6B, the illuminated open/closed state display unit 56a notifies the driver or the like that the lid member 26 is open.

Figure 7A:
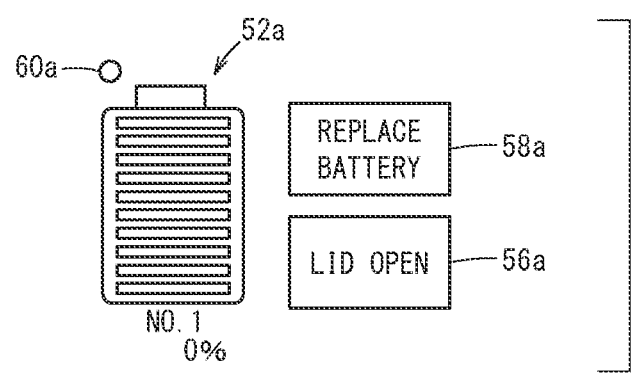
FIG. 7A is a diagram illustrating a display example in a state where a detachable battery is detached.

When the driver or the like removes the detachable battery 16a from the electric power storage device housing unit 24, the screen 62 of the display device 38 is switched to the display content of FIG. 7A. In FIG. 7A, the battery connection state display unit 60a is not illuminated. In FIG. 7A, the open/closed state display unit 56a and the battery replacement display unit 58a are illuminated. Further, the battery remaining amount display unit 52a turns off all the segments. The battery remaining amount display unit 52a displays the characters "0%" indicating the numerical value of the SOC.

Figure 7B:
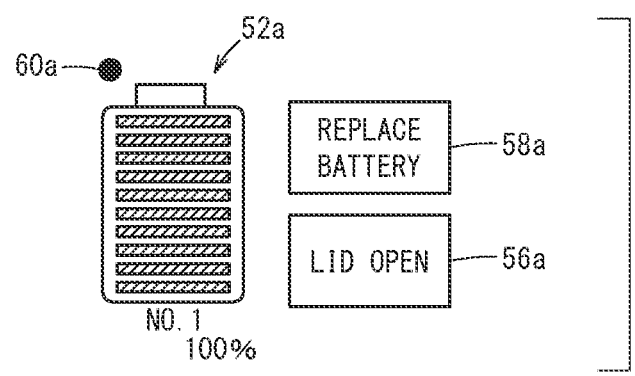
FIG. 7B is a diagram illustrating a display example when a detachable battery is loaded.
Figure 9:
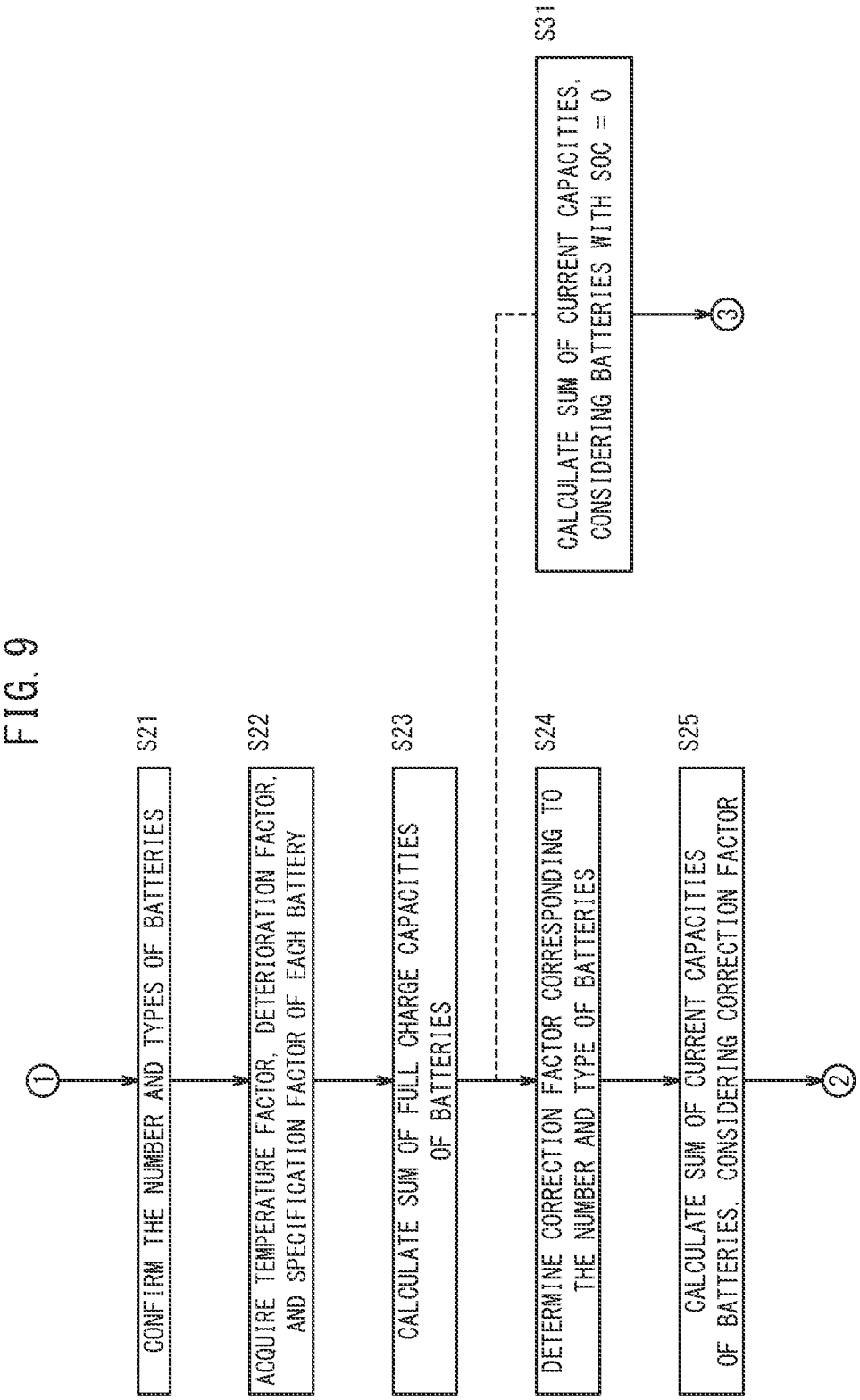
FIG. 9 is a flowchart illustrating second and third examples.

Next, when the driver or the like loads a detachable battery 16a in a full charge state into the electric power storage device housing unit 24, the screen 62 of the display device 38 is switched to the display content of FIG. 7B. In FIG. 7B, the battery connection state display unit 60a, the open/closed state display unit 56a and the battery replacement display unit 58a are all illuminated. The battery remaining amount display unit 52a turns on all the segments. The battery remaining amount display unit 52a displays the characters "100%" indicating the numerical value of the SOC.

Next, when the driver or the like closes the lid member 26, the screen 62 of the display device 38 is switched to the display content of FIG. 5A. As a result, the open/closed state display unit 56a and the battery replacement display unit 58a are turned off.

3. SOC Calculation Process

Next, characteristic functions of the electric power device 10 according to the present embodiment will be described with reference to FIGS. 8 to 10B. The characteristic functions are functions of accurately calculating the overall SOC of the plurality of detachable batteries 16 even when the plurality of detachable batteries 16 of different types are housed in the electric power storage device housing units 24. Note that this characteristic functions can also be applied to the SOC calculation processing for a plurality of detachable batteries 16 of the same type.

Each of three methods (a first example shown in FIG. 8, and second and third examples shown in FIG. 9) SOC by the characteristic functions will be described in order.

3.1 FIRST EXAMPLE

In the first example of FIG. 8, the control unit 30 (see FIG. 1) calculates the overall SOC of the plurality of detachable batteries 16 in consideration of the temperature factor, the deterioration factor, and the specification factor (specification difference value) of each of the four detachable batteries 16. Therefore, the first example can be applied to both the four detachable batteries 16 of the same type and the four detachable batteries 16 of different types.

Examples of the difference in types of the detachable batteries 16 include a difference in capacity or output, and a difference in battery structure. In the present embodiment, even if the detachable batteries 16 have the same structure, they are treated as different types of detachable batteries 16 when there is a difference in types such as a standard type, a high-output type, or a high-capacity type. In addition, if the detachable batteries 16 include a general battery pack and a battery for a hybrid vehicle, they are also treated as different types.

First, in step S1, a driver turns on the ignition switch 46. As a result, an ignition signal is supplied from the ignition switch 46 to the control unit 30. Thus, the electric power supply system 15 (electric power device 10) in the vehicle 12 is activated.

In the next step S2, the communication unit 30a of the control unit 30 acquires information of each detachable battery 16 from each BMU 40 via the CAN 44. The acquired information includes the SOC of each detachable battery 16, a state indicating whether or not each detachable battery 16 is loaded in each electric power storage device housing unit 24, and the like. In step S2, the SOC information acquired by the communication unit 30a includes the current charge capacities, the current full charge capacities, and the specification values or initial values of the full charge capacities, of the respective detachable batteries 16.

In the next step S3, the control unit 30 determines whether or not each detachable battery 16 is accommodated in each electric power storage device housing unit 24 based on the information of each detachable battery 16 acquired by the communication unit 30a. Further, the control unit 30 determines whether the SOC of each detachable battery 16 is not 0%.

In step S3, when the detachable batteries 16 are accommodated in all the electric power storage device housing units 24 and there is no detachable battery 16 having the SOC of 0% (step S3: YES), the control unit 30 proceeds to the process of step S4.

In step S4, the control unit 30 confirms the type of each detachable battery 16, based on the information of each detachable battery 16 acquired in step S2.

In step S5, the communication unit 30a of the control unit 30 acquires the temperature factor, the deterioration factor, and the specification factor of each detachable battery 16 from each BMU 40 via the CAN 44. The specification factor is a factor relating to a specification difference of the own detachable battery 16 with respect to a reference detachable battery 16 when an arbitrary detachable battery 16 is set as the reference detachable battery. Therefore, the specification factor is a kind of specification difference value. For example, when a capacity of a reference detachable battery 16 is 1000 Wh, the specification factor of the detachable battery 16 having a capacity of 500 Wh is 0.5 (500/1000=0.5). Also, the specification factor of the detachable battery 16 having a capacity of 2000 Wh volume is 2.0 (2000/1000=2.0).

In step S6, the control unit 30 calculates a sum FCC of the full charge capacities of the respective detachable batteries 16, based on the information of the detachable batteries 16 acquired by the communication unit 30a from each BMU 40 via the CAN 44. In this case, the sum FCC of the full charge capacities is a sum FCC0 of the specification values or the initial values of the full charge capacities of the respective detachable batteries 16 if each detachable battery 16 is not deteriorated. When each detachable battery 16 is deteriorated, the sum FCC of the full charge capacities is the sum of the full charge capacities at the present time. That is, the sum FCC of the full charge capacities is expressed by a following expression (1). Note that $\Sigma$ is a mathematical symbol indicating the sum.

$$FCC = \Sigma(\text{full charge capacity of each detachable battery 16}) \quad (1)$$

In step S7, the control unit 30 calculates a sum RC of the current remaining capacities (current charge capacities) of the respective detachable batteries 16, based on the information of the detachable batteries 16 acquired by the communication unit 30a from each BMU 40 via the CAN 44. In this case, the control unit 30 calculates the sum RC of the current charge capacities, based on the full charge capacities and the current SOCs of the respective detachable batteries 16. Alternatively, the control unit 30 may calculate the sum RC of the current charge capacities, based on the SOC, the temperature factor, the deterioration factor and the specification factor, of each detachable battery 16. Further, the control unit 30 may calculate the sum RC of the current charge capacities, based on a time integration value of the current (charging current, discharging current) for charging and discharging each detachable battery 16.

Therefore, the sum RC of the current charge capacities is expressed by any one of the following expressions (2) to (4).

$$RC=\Sigma\{(SOC \text{ of each detachable battery } 16)\times(\text{temperature factor})\times(\text{deterioration factor})\times(\text{specification factor})\} \quad (2)$$

$$RC=\Sigma\{(\text{full charge capacity of each detachable battery } 16)\times(SOC \text{ of each detachable battery } 16)\} \quad (3)$$

$$RC=\Sigma(\text{integrated value of current for charging and discharging each detachable battery } 16) \quad (4)$$

In step S8, the control unit 30 divides the sum RC of the current charge capacities of the respective detachable batteries 16 by the sum FCC of the full charge capacities of the respective detachable batteries 16. Thus, RSOC, which is the overall SOC of the respective detachable batteries 16, is calculated. In this case, RSOC is expressed by the following expression (5).

$$RSOC=RC/FCC \quad (5)$$

In step S9, the control unit 30 controls each BMU 40 and each DC/DC converter 32 based on the calculated RSOC and the like.

In this case, the control unit 30 assigns IDs to the respective BMUs 40 (detachable batteries 16), to transmit and receive information via each CAN 44. The control unit 30 outputs the assigned IDs from the communication unit 30a to the CAN 44. Further, based on the RSOC or the like, the control unit 30 outputs control commands for controlling the BMUs 40 to which IDs have been assigned, from the communication unit 30a to the CAN 44. Thus, each of the BMUs 40 causes a current to flow from the detachable battery 16 to the DC/DC converter 32, based on the control command acquired from the CAN 44.

Further, the control unit 30 adjusts the current command values for the respective DC/DC converters 32 in consideration of the RSOC. The control unit 30 outputs the respective current command values which have been adjusted, from the communication unit 30a to the CAN 44. Each of the DC/DC converters 32 converts the voltage output from the detachable battery 16 based on the current command value acquired from the CAN 44.

In step S10, the control unit 30 sets the display content of the display device 38 according to the calculated RSOC and the like as a display control signal. The control unit 30 outputs the set display control signal from the communication unit 30a to the CAN 44. Accordingly, the display device 38 carries out screen displays in FIGS. 5A to 7B and the like, based on the display control signal and the like acquired by the communication unit 38a via the CAN 44.

In step S11, when the process of steps S2 to S11 is executed again (step S11: YES), the control unit 30 returns to step S2. Alternatively, after the driver confirms the display content of the display device 38 in step S10, the driver may drive the vehicle 12 in step S12. Thus, the vehicle 12 can be moved. In this case, after step S12, the determination processing of step S11 is executed.

3.2 SECOND EXAMPLE

The second example relates to a calculation process of the overall SOC of the respective detachable batteries 16 in a case where any of the electric power storage device housing units 24 does not house a detachable battery 16, or in a case where any of the detachable batteries 16 has an SOC of 0% even if each electric power storage device housing unit 24 houses a detachable battery 16.

In this case, the number of detachable batteries 16 to supply electric power is decreased. Therefore, the load per detachable battery 16 increases. Also, the overall output of the plurality of detachable batteries 16 is decreased. As a result, the overall capacity of the plurality of detachable batteries 16 is rather decreased. This will be specifically described with reference to FIGS. 10A and 10B.

Figure 10A:
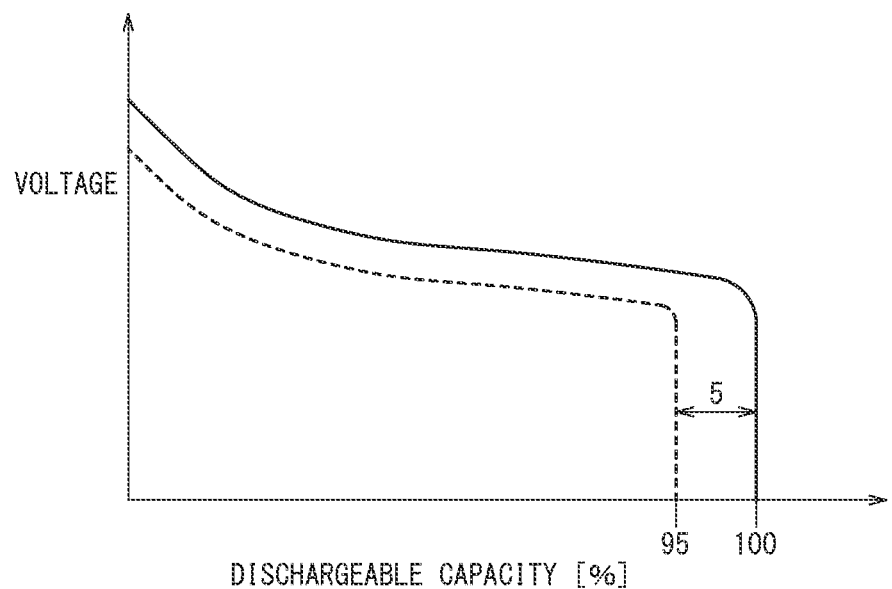
FIG. 10A is a diagram illustrating a relationship between an output voltage and a dischargeable capacity of a standard type detachable battery.

FIG. 10A shows a relationship between the voltage and the overall dischargeable capacity of the plurality of detachable batteries 16 of a standard type. A solid line indicates a result when four detachable batteries 16 are mounted in the vehicle 12. When the four detachable batteries 16 in a full charge state are mounted in the vehicle 12, the overall dischargeable capacity of the four detachable batteries 16 is 100%. Further, the four detachable batteries 16 are subjected to 1 C discharge.

Further, in FIG. 10A, a broken line indicates a case where two detachable batteries 16 are mounted in the vehicle 12. In the case of the broken line, when the two detachable batteries 16 in a full charge state are mounted in the vehicle 12, the overall dischargeable capacity of the two detachable batteries 16 is reduced to 95% compared to the total dischargeable capacity (100%) of the four detachable batteries 16. In addition, compared to the case of four detachable batteries 16, the load per detachable battery increases in the case of two detachable batteries 16. Thus, the two detachable batteries 16 are subjected to 2 C discharge at a high discharge rate. For example, using the four detachable batteries 16 (solid line) or the two detachable batteries 16 (broken line), when the same output (10 kW) is produced, the four detachable batteries 16 have a closed circuit voltage of about 50 V and a discharge current of about 160 A (40 A per battery). In the case of two detachable batteries 16, a closed circuit voltage drops to 45 V. In the case of two detachable batteries 16, a discharge current increases to 200 A (100 A per battery).

Figure 10B:
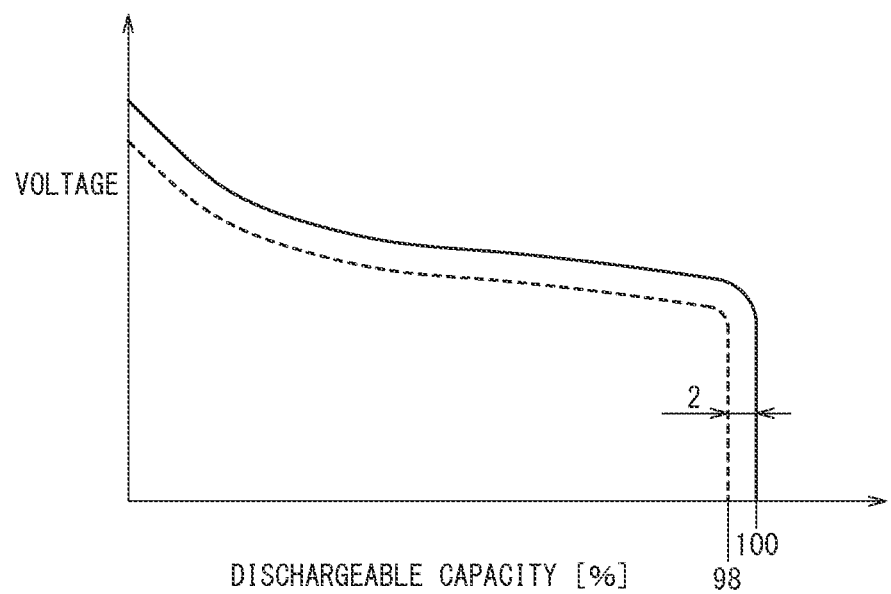
FIG. 10B is a diagram illustrating a relationship between an output voltage and a dischargeable capacity of a high-power type detachable battery.

FIG. 10B shows a relationship between the voltage and the overall dischargeable capacity of the plurality of detachable batteries 16 of a high-output type. A solid line indicates a case when four detachable batteries 16 are mounted in the vehicle 12. Also in FIG. 10B, when the four detachable batteries 16 in a full charge state are mounted in the vehicle 12, the overall dischargeable capacity of the four detachable batteries 16 is 100%. The four detachable batteries 16 are subjected to 1 C discharge.

Further, in FIG. 10B, a broken line indicates a case where two detachable batteries 16 are mounted in the vehicle 12. With the high-output type, in the case of the broken line, when the two detachable batteries 16 in a full charge state are mounted in the vehicle 12, the overall dischargeable capacity of the two detachable batteries 16 is reduced to 98% compared to the total dischargeable capacity (100%) of the four detachable batteries 16. Therefore, also in FIG. 10B, compared to the case of four detachable batteries 16, the load per detachable battery 16 is increased in the case of two detachable batteries 16. Thus, the two detachable batteries 16 are subjected to 2 C discharge. However, in comparison with the result of the standard type detachable battery 16 (broken line in FIG. 10A), the decrease in dischargeable capacity is suppressed to 2% in the result indicated by the broken line in FIG. 10B.

Therefore, in the second example, the overall SOC of the respective detachable batteries 16 is calculated in consideration of an increase in the load of the detachable batteries 16 due to such a decrease in the number. In the following description of the second embodiment, a case where two detachable batteries 16 of the same type are mounted in the vehicle 12 will be described.

More specifically, in step S2 of FIG. 8, when the four detachable batteries 16 are not housed in the electric power storage device accommodating unit electric power storage device housing unit 24 or when the SOC of at least one detachable battery 16 among the detachable batteries 16 is 0% (step S2: NO), the control unit 30 proceeds to step S21 in FIG. 9.

In step S21, the control unit 30 confirms the number of the detachable batteries 16 mounted in the vehicle 12 and the types of the detachable batteries 16, based on the information of the detachable batteries 16 acquired by the communication unit 30a.

In step S22, the communication unit 30a of the control unit 30 acquires the temperature factor, the deterioration factor, and the specification factor of each detachable battery 16 from each BMU 40 via the CAN 44 in the same manner as in step S4. When the detachable battery 16 is not housed in the electric power storage device housing unit 24, the above information cannot be acquired. Even when the detachable battery 16 is housed in the electric power storage device housing unit 24, if the SOC is 0%, the communication unit 30a of the control unit 30 acquires information indicating that the SOC is 0%.

In step S23, the control unit 30 calculates a sum FCC of the full charge capacities of the detachable batteries 16 in the same manner as in step S6. In this case, the control unit 30 calculates the sum FCC of the full charge capacities of the two detachable batteries 16.

In step S24, the control unit 30 calculates the sum RC0 of the current charge capacities of the two housed detachable batteries 16. Next, the control unit 30 determines a correction factor corresponding to the number and type of the detachable batteries 16 mounted in the vehicle 12.

Here, the correction factor is, for example, a numerical value corresponding to a decrease in dischargeable capacity caused by a decrease in the number of detachable batteries 16 mounted in the vehicle 12 from four to two. More specifically, for the standard detachable battery 16 of FIG. 10A, the correction factor is 0.95, which corresponds to a 5% reduction. In addition, in the case of the high-output type detachable battery 16 in FIG. 10B, the correction factor is 0.98 corresponding to a decrease of 2%.

In step S25, the control unit 30 calculates the sum RC of the current charge capacities of the detachable batteries 16 in consideration of the correction factor. That is, the control unit 30 calculates the sum RC by using the following expression (6).

$$RC = RC0 \times (\text{correction factor}) \qquad (6)$$

In step S8 of FIG. 8 after step S25, the control unit 30 calculates the RSOC from the expression (5) using the sum RC of the current charge capacities calculated from the expression (6) and the sum FCC of the full charge capacities.

3.3 THIRD EXAMPLE

A third example differs from the second example in the following points. In the third example, even when the number of the detachable batteries 16 mounted in the vehicle 12 is small, the sum of the full charge capacities of the four detachable batteries 16 is set as the sum FCC of the full charge capacities. On the other hand, in the third example, the remaining capacities corresponding to the number of the mounted detachable batteries 16 is set as the sum RC of the current charge capacities.

In this case, in step S23, the control unit 30 calculates the sum FCC of the full charge capacities of the four detachable batteries 16 in the same manner as in step S6.

After step S23, the control unit 30 proceeds to step S31. The control unit 30 calculates the sum RC of the current charge capacities in consideration of the number of detachable batteries 16 that are not mounted in the vehicle 12. That is, the control unit 30 calculates the sum of the current charge capacities of the two detachable batteries 16 mounted in the vehicle 12 as the sum RC.

In step S8 of FIG. 8 after step S31, the control unit 30 calculates the RSOC from expression (5) using the sum FCC of the full charge capacities calculated in step S23 and the sum RC of the current charge capacities calculated in step S31.

3.4 MODIFICATION OF EACH EXAMPLE

In each of the above examples, the case where the sum RC of the current charge capacities is calculated after calculating the sum FCC of the full charge capacities has been described (step S6→step S7; step S23→step S25 or step S31). In the present embodiment, it is also possible to first calculate the sum RC of the current charge capacities. Thereafter, in the present embodiment, it is possible to calculate the sum FCC of the full charge capacities (step S7→step S6; step S25 or step S31→step S23).

In each of the above examples, the control unit 30 acquires the full charge capacities and the current charge capacities in step S2. In the present embodiment, however, the control unit 30 may acquire the current charge capacities and the full charge capacities in step S5 or S22. Alternatively, in step S2, the control unit 30 may acquire either the full charge capacities or the current charge capacities. In step S5 or S22, it is also possible for the control unit 30 to acquire the charge capacities that were not acquired.

In the present embodiment, the control unit 30 may acquire either the full charge capacities or the current charge capacities and then calculate the sum of the acquired charge capacities. In this case, the control unit 30 can then execute a process to acquire the other charge capacities and calculate the sum of the other charge capacities acquired.

As described above, in the present embodiment, it should be noted that the processing order in the control unit 30 is not limited to the order described in the first to third examples.

4. Advantageous Effects of Present Embodiment

As described above, according to the present embodiment, the electric power device 10 including the plurality of detachable batteries (electric power storage units) 16a to 16d (16) that are chargeable and dischargeable is provided, and the control unit 30 (state of charge calculation unit) is configured to calculate the RSOC which is the overall SOC (state of charge) of the plurality of detachable batteries 16a to 16d, based on the sum FCC of full charge capacities of the respective detachable batteries 16a to 16d and the sum RC of current charge capacities of the respective detachable batteries 16a to 16d.

Further, according to the present embodiment, the display device 38 includes the communication unit 38a (receiving unit) configured to receive the overall SOC (RSOC) of the plurality of detachable batteries 16a to 16d from the electric power device 10 is provided, and the display device 38 is configured to display the received RSOC.

Further, according to the present embodiment, the state of charge calculation method for the electric power device 10 including the plurality of detachable batteries 16a to 16d (16) that are chargeable and dischargeable is provided. The method includes the steps of acquiring full charge capacities of the plurality of detachable batteries 16a to 16d, respectively (step S2), calculating the sum FCC of the plurality of full charge capacities (step S6, step S23), acquiring current charge capacities of the plurality of detachable batteries 16a to 16d, respectively (step S2), calculating the sum RC of the plurality of current charge capacities (step S7, step S25, step S31), and calculating the RSOC based on the sum FCC of the full charge capacities and the sum RC of the current charge capacities (step S8).

Furthermore, according to the present embodiment, the program is provided. The program causes the control unit 30 of the electric power device 10 as a computer to execute the steps of acquiring full charge capacities of the plurality of detachable batteries 16a to 16d, respectively (step S2), calculating the sum FCC of the plurality of full charge capacities (step S6, step S23), acquiring current charge capacities of the plurality of detachable batteries 16a to 16d, respectively (step S2), calculating the sum RC of the plurality of current charge capacities (step S7, step S25, step S31), and calculating the RSOC based on the sum FCC of the full charge capacities and the sum RC of the current charge capacities (step S8).

Further still, according to the present embodiment, the storage unit 30b (storage medium) is provided. The storage unit 30b stores the above-described program.

As described above, by using the sum FCC of the full charge capacities of the respective detachable batteries 16a to 16d and the sum RC of the current charge capacities of the respective detachable batteries 16a to 16d, it is possible to accurately calculate the RSOC as the overall SOC of the plurality of detachable batteries 16a to 16d. Further, it is possible to display the RSOC obtained in this way.

In this case, each of the full charge capacities is acquired based on the specification value or the initial value related to the full charge capacity of each of the detachable batteries 16a to 16d. Accordingly, it is possible to calculate the RSOC more accurately.

Further, each of the full charge capacities is acquired based on at least one of a temperature or a degree of deterioration of each of the detachable batteries 16a to 16d. Accordingly, it is possible to calculate the RSOC more accurately, based on a current status of each of the detachable batteries 16a to 16d.

Furthermore, if any of the plurality of the detachable batteries 16a to 16d has a specification difference, the full charge capacity thereof is acquired based on a specification difference value (e.g., specification factor) set according to the specification difference. Accordingly, it is possible to accurately calculate the RSOC, considering the specification difference of each of the detachable batteries 16a to 16d.

Further still, each of the current charge capacities is acquired based on an integrated value of an electric current that charges and discharges each of the detachable batteries 16a to 16d. Accordingly, it is possible to calculate the RSOC correctly.

Further, the control unit 30 may calculate the RSOC by dividing the sum RC of the current charge capacities by the sum FCC of the full charge capacities. Accordingly, it is possible to calculate the RSOC easily.

Furthermore, as in the second example, the control unit 30 corrects the sum RC of the current charge capacities in accordance with the number and the types of the plurality of detachable batteries 16a to 16d. Accordingly, it is possible to calculate the most suitable RSOC, considering decreased discharge capacity due to the decrease in the number of the plurality of detachable batteries 16a to 16d.

Further still, as in the third example, the control unit 30 corrects the sum RC of the current charge capacities in accordance with the number of the detachable batteries 16a to 16d having the current charge capacity of 0 (zero). Also in this case, it is possible to calculate the most suitable RSOC, considering decreased discharge capacity due to the decrease in the number of the plurality of detachable batteries 16a to 16d.

Further, the plurality of detachable batteries 16a to 16d are electric power storage devices that are attachable to and detachable from the vehicle 12, and the control unit 30 is a control device mounted in the vehicle 12. Accordingly, the electric power device 10 can be suitably applied as the electric power supply system 15 of the vehicle 12.

Further, the electric power device 10 further includes the communication unit 30a (transmission unit) configured to transmit the RSOC calculated by the control unit 30 to the display device 38. Accordingly, the display device 38 can receive the RSOC by the communication unit 38a and display the received RSOC reliably.

The present invention is not limited to the above-described embodiment, and it is a matter of course that various alternative or additional configurations could be adopted therein based on the content disclosed in the present specification.

What is claim is:

1. An electric power device including a plurality of electric power storage units that are chargeable and dischargeable, the electric power device comprising:
    a state of charge calculation unit configured to calculate an overall state of charge of the plurality of electric power storage units, based on a sum of full charge capacities of the respective electric power storage units and a sum of current charge capacities of the respective electric power storage units,
    wherein if any of the plurality of electric power storage units has a specification difference, the full charge capacity thereof is acquired based on a specification difference value set according to the specification difference.

2. The electric power device according to claim 1, wherein each of the full charge capacities is acquired based on a specification value or an initial value related to a full charge capacity of each of the electric power storage units.

3. The electric power device according to claim 1, wherein each of the full charge capacities is acquired based on at least one of a temperature or a degree of deterioration of each of the electric power storage units.

4. The electric power device according to claim 1, wherein each of the current charge capacities is acquired based on an integrated value of an electric current that charges and discharges each of the electric power storage units.

5. The electric power device according to claim 1, wherein the state of charge calculation unit is configured to calculate the overall state of charge of the plurality of electric power storage units by dividing the sum of the current charge capacities by the sum of the full charge capacities.

6. The electric power device according to claim 1, wherein the state of charge calculation unit is configured to correct the sum of the current charge capacities in accordance with a number and types of the plurality of electric power storage units.

7. The electric power device according to claim 1, wherein the state of charge calculation unit is configured to correct the sum of the current charge capacities in accordance with a number of the electric power storage units having the current charge capacity of 0.

8. The electric power device according to claim 1, wherein the plurality of electric power storage units are electric power storage devices that are attachable to and detachable from a vehicle, and
the state of charge calculation unit is a control device mounted in the vehicle.

9. The electric power device according to claim 1, further comprising a transmission unit configured to transmit the overall state of charge of the plurality of electric power storage units calculated by the state of charge calculation unit to a display device.

10. A display device comprising a receiving unit configured to receive an overall state of charge of a plurality of electric power storage units from an electric power device, and the display device being configured to display the received overall state of charge of the plurality of electric power storage units,
the electric power device including:
the plurality of electric power storage units that are chargeable and dischargeable; and
a state of charge calculation unit configured to calculate the overall state of charge of the plurality of electric power storage units, based on a sum of full charge capacities of the respective electric power storage units and a sum of current charge capacities of the respective electric power storage units,
wherein if any of the plurality of electric power storage units has a specification difference, the full charge capacity thereof is acquired based on a specification difference value set according to the specification difference.

11. A state of charge calculation method for an electric power device including a plurality of electric power storage units that are chargeable and dischargeable, the method comprising the steps of:
acquiring full charge capacities of the plurality of electric power storage units, respectively;
calculating a sum of the plurality of full charge capacities;
acquiring current charge capacities of the plurality of electric power storage units, respectively;
calculating a sum of the plurality of current charge capacities; and
calculating an overall state of charge of the plurality of electric power storage units based on the sum of the full charge capacities and the sum of the current charge capacities,
wherein if any of the plurality of electric power storage units has a specification difference, the full charge capacity thereof is acquired based on a specification difference value set according to the specification difference.

12. A storage medium storing a program causing a computer to execute the steps of:
acquiring full charge capacities of a plurality of electric power storage units, respectively;
calculating a sum of the plurality of full charge capacities;
acquiring current charge capacities of the plurality of electric power storage units, respectively;
calculating a sum of the plurality of current charge capacities; and
calculating an overall state of charge of the plurality of electric power storage units based on the sum of the full charge capacities and the sum of the current charge capacities,
wherein if any of the plurality of electric power storage units has a specification difference, the full charge capacity thereof is acquired based on a specification difference value set according to the specification difference.

13. An electric power device including a plurality of electric power storage units that are chargeable and dischargeable, the electric power device comprising:
a state of charge calculation unit configured to calculate an overall state of charge of the plurality of electric power storage units, based on a sum of full charge capacities of the respective electric power storage units and a sum of current charge capacities of the respective electric power storage units,
wherein the state of charge calculation unit is configured to correct the sum of the current charge capacities in accordance with a number and types of the plurality of electric power storage units.

14. An electric power device including a plurality of electric power storage units that are chargeable and dischargeable, the electric power device comprising:
a state of charge calculation unit configured to calculate an overall state of charge of the plurality of electric power storage units, based on a sum of full charge capacities of the respective electric power storage units and a sum of current charge capacities of the respective electric power storage units,
wherein the state of charge calculation unit is configured to correct the sum of the current charge capacities in accordance with a number of the electric power storage units having the current charge capacity of 0.

* * * * *